(12) United States Patent
Watanabe

(10) Patent No.: US 7,923,806 B2
(45) Date of Patent: Apr. 12, 2011

(54) EMBEDDED WIRING IN COPPER DAMASCENE WITH VOID SUPPRESSING STRUCTURE

(75) Inventor: Kenichi Watanabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 177 days.

(21) Appl. No.: 11/084,014

(22) Filed: Mar. 21, 2005

(65) Prior Publication Data

US 2005/0161825 A1 Jul. 28, 2005

Related U.S. Application Data

(63) Continuation of application No. PCT/JP2003/004049, filed on Mar. 28, 2003.

(51) Int. Cl.
*H01L 29/00* (2006.01)

(52) U.S. Cl. . 257/503; 257/508; 257/774; 257/E23.145; 257/E23.151; 257/E21.575

(58) Field of Classification Search .................. 257/503, 257/508, 774, E23.145, E23.151, E21.575
See application file for complete search history.

(56) References Cited

U.S. PATENT DOCUMENTS

| | | | | |
|---|---|---|---|---|
| 5,380,546 | A | * | 1/1995 | Krishnan et al. ............ 427/126.1 |
| 5,850,120 | A | | 12/1998 | Okamoto |
| 6,017,803 | A | * | 1/2000 | Wong .............................. 438/430 |
| 6,069,068 | A | | 5/2000 | Rathore et al. |
| 6,083,835 | A | * | 7/2000 | Shue et al. ..................... 438/687 |
| 6,114,243 | A | * | 9/2000 | Gupta et al. ................... 438/687 |
| 6,130,161 | A | | 10/2000 | Ashley et al. |
| 6,147,404 | A | | 11/2000 | Pramanick et al. |
| 6,184,124 | B1 | * | 2/2001 | Hasegawa et al. ............ 438/625 |
| 6,218,302 | B1 | * | 4/2001 | Braeckelmann et al. ..... 438/687 |
| 6,245,663 | B1 | * | 6/2001 | Zhao et al. ..................... 438/622 |
| 6,319,825 | B1 | | 11/2001 | Jung et al. |
| 6,358,848 | B1 | | 3/2002 | Lopatin |
| 6,376,353 | B1 | * | 4/2002 | Zhou et al. .................... 438/612 |
| 6,407,453 | B1 | | 6/2002 | Watanabe et al. |
| 6,424,036 | B1 | | 7/2002 | Okada |

(Continued)

FOREIGN PATENT DOCUMENTS
EP 0881673 A2 12/1998

(Continued)

OTHER PUBLICATIONS

Translation of Korean Office Action dated Jul. 31, 2006, issued in corresponding Korean Application No. 10-2005-7005699.

(Continued)

*Primary Examiner* — Thanh V Pham
(74) *Attorney, Agent, or Firm* — Westerman, Hattori, Daniels & Adrian, LLP

(57) ABSTRACT

A semiconductor device capable of restricting a void growth in a copper wiring. The semiconductor device comprises a semiconductor substrate, an insulation layer formed above the semiconductor substrate, a barrier metal layer that is a first damascene wiring buried in the insulation layer, defines the bottom face and the side faces, and also defines a first hollow part at the inner side, a copper wiring layer disposed in the first hollow part and defining a second hollow part at the inner side, a first damascene wiring disposed in the second hollow part and containing an auxiliary barrier metal layer separated from the barrier metal layer, and an insulating copper diffusion preventing film disposed on the first damascene wiring and the insulation layer.

26 Claims, 9 Drawing Sheets

U.S. PATENT DOCUMENTS

| | | | |
|---|---|---|---|
| 6,426,294 B1 * | 7/2002 | Hirabayashi et al. | 438/690 |
| 6,433,429 B1 | 8/2002 | Stamper | |
| 2001/0038147 A1 | 11/2001 | Higashi et al. | |
| 2002/0036348 A1 | 3/2002 | Matsunaga et al. | |

FOREIGN PATENT DOCUMENTS

| | | |
|---|---|---|
| JP | 6-275612 | 9/1994 |
| JP | 9-275138 | 10/1997 |
| JP | 11-45887 A | 2/1999 |
| JP | 11-102911 | 4/1999 |
| JP | 3057054 | 4/2000 |
| JP | 2000-260770 A | 9/2000 |
| JP | 2001-60589 | 3/2001 |
| JP | 2001-110809 | 4/2001 |
| JP | 2001-217243 | 8/2001 |
| JP | 2002-64138 A | 2/2002 |
| JP | 2002-110676 | 4/2002 |
| JP | 2002-110676 A | 4/2002 |
| JP | 2003-031574 | 1/2003 |
| JP | 2003-031574 A | 1/2003 |

OTHER PUBLICATIONS

Chinese Office Action dated Aug. 18, 2006, issued in corresponding Chinese Application No. 038258927.

Japanese Office Action mailed Oct. 21, 2008, issued in corresponding Japanese Office Action 2004-570148.

Supplementary European Search Report dated Mar. 31, 2009, issued in corresponding European patent application No. 03715631.

European Office Action dated Feb. 8, 2010, issued in corresponding European Patent Application No. 03715631.2.

* cited by examiner

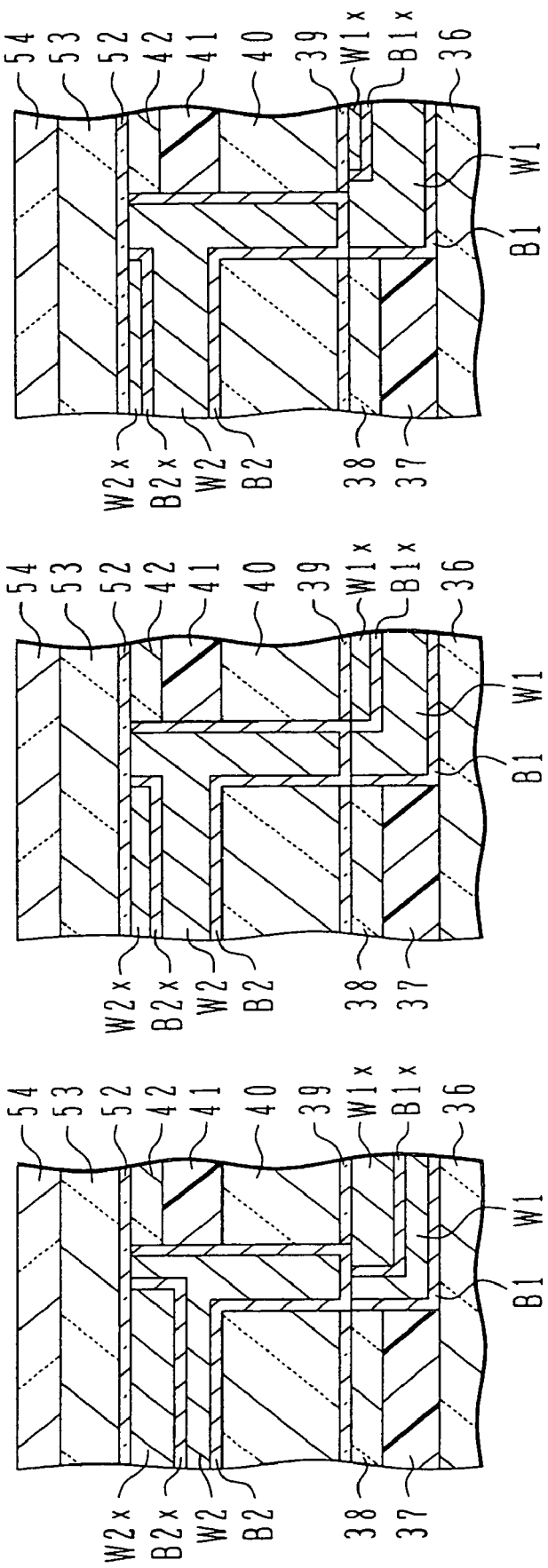

EMBEDDED WIRING IN COPPER DAMASCENE WITH VOID SUPPRESSING STRUCTURE

This application is a Continuation Application of PCT/JP2003/004049 filed on Mar. 28, 2003, the entire contents of which are incorporated herein by reference.

TECHNICAL FIELD

The present invention relates to a semiconductor device, and more particularly to a semiconductor device having copper damascene wirings.

BACKGROUND ART

While the integration degree is improved and the semiconductor devices and wirings in a semiconductor integrated circuit are made fine, the number of multi-layer wiring layers is increasing still more. It is desired to reduce the resistance of a fine wiring so as to guarantee a high speed operation in the wiring. In place of aluminum, copper having a lower resistance is used. A copper wiring forming process has a limit, if this process forms a copper wiring by finely patterning a copper layer through photolithography.

In order to form a fine copper wiring, a damascene process has been adopted. A wiring trench and/or via hole is formed in an insulating layer, the trench and/or via hole is buried with a copper wiring layer, and an unnecessary copper wiring layer on the insulating layer is removed by chemical mechanical polishing (CMP) or the like. The damascene process includes a single damascene process and a dual damascene process.

With the single damascene process, a via hole is formed through a lower level insulating layer and buried with a copper wiring layer, and an unnecessary portion is removed by CMP. Next, an upper level insulating layer is formed, a wiring trench is formed and buried with a copper wiring layer, and an unnecessary portion is removed by CMP. With the dual damascene process, an insulating layer is formed, a recess having a wiring trench and a via hole is formed thorough the insulating layer and buried with a copper wiring layer, and an unnecessary portion is removed by CMP.

Copper has the properties that it is diffused into an insulating layer and the insulating characteristics of the insulating layer are degraded. Therefore, when a copper wiring is formed by the damascene process, a barrier metal layer having a copper diffusion preventing function is formed, and then a copper layer is formed on the barrier metal layer. Used as barrier metal are nitride such as titanium nitride TiN and tantalum nitride TaN, tantalum Ta and the like.

A copper layer is exposed on the surface of a copper wiring after CMP. In order to prevent copper from diffusing from this copper layer to an upper level insulating layer, the surface of the copper wiring is covered with an insulating copper diffusion preventing layer. This copper diffusion preventing layer has also an etch stopper function when the upper level insulating layer is etched. The insulating copper diffusion preventing layer is usually made of silicon nitride SiN, silicon carbide SiC or the like.

There is the proposal that after a copper wiring with a lower level barrier metal layer is formed, the surface of a wiring layer is etched and dug, and an upper level barrier metal layer is formed and an unnecessary portion is removed by CMP (Patent Document 1). The structure has been proposed which has a recess in an upper level barrier layer in which an aluminum layer is buried (Patent Document 2).

It is desired to reduce an effective dielectric constant of an insulating layer surrounding a wiring so as to guarantee a high speed operation in the wiring. Although an etch stopper and copper diffusion preventing film is made of SiN or SiC, other insulating layers are preferably made of material having a low dielectric constant in order to reduce parasitic capacitance of wirings. Insulating materials having a dielectric constant lower than that of silicon oxide have the properties specific to each material. A multi-layer wiring structure is desired to be formed by considering the properties of each insulating material.

Patent Document 1:
 Japanese Patent Laid-open Publication No. HEI-6-275612
Patent Document 2:
 Japanese Patent Laid-open Publication No. 2001-110809

DISCLOSURE OF THE INVENTION

An object of the present invention is to provide a semiconductor device having long-life copper wirings.

Another object of the present invention is to provide a semiconductor device capable of suppressing voids in copper wirings.

According to one aspect of the present invention, there is provided a semiconductor device comprising: a semiconductor substrate; an insulating layer formed above the semiconductor substrate; a first damascene wiring buried in the insulating layer and including: a barrier metal layer defining a bottom and a side wall of the first damascene wiring and defining a first hollow portion inside the first damascene wiring; a copper wiring layer disposed in the first hollow portion and defining a second hollow portion inside the copper wiring layer; and an auxiliary barrier metal layer disposed in the second hollow portion and separated from the barrier metal layer; and an insulating copper diffusion preventing film disposed on the first damascene wiring and the insulating layer.

According to another aspect of the present invention, there is provided a semiconductor integrated circuit device comprising: a semiconductor substrate formed with a number of semiconductor elements; a laminated insulating layer formed on the semiconductor substrate; and a multi-layer wiring including a plurality of lower level wiring layers and a plurality of upper level wiring layers buried in the laminated insulating layer, each wiring layer including a wiring pattern for intra-layer connection and a via for inter-layer connection, and at least one layer of the upper wiring layers including a first damascene wiring buried in the laminated insulating layer, the first damascene wiring including: a barrier metal layer defining a bottom and a side wall of the first damascene wiring and defining a first hollow portion inside the first damascene wiring; a continuous copper wiring layer disposed in the first hollow portion and defining a second hollow portion inside the copper wiring layer; and an auxiliary barrier metal layer disposed in the second hollow portion and separated from the barrier metal layer, wherein the laminated insulating layer include an insulating copper diffusion preventing film disposed on each wiring layer.

BRIEF DESCRIPTION OF THE DRAWINGS

FIGS. 4A to 4C are cross sectional views showing contact portions between a via conductor and a lower level wiring layer according to embodiments of the present invention.

BEST MODE FOR CARRYING OUT THE INVENTION

It is known that electromigration is the phenomenon that aluminum atoms in an aluminum wiring migrate due to current. It is said that occurrence of electromigration is more difficult in copper than in aluminum. However, electromigration still occurs in a copper wiring.

Preliminary experiments made by the present inventor will be described first. The present inventor formed samples having dual damascene wirings, and conducted acceleration tests to observe the formation of voids due to electromigration.

Figure 9A:
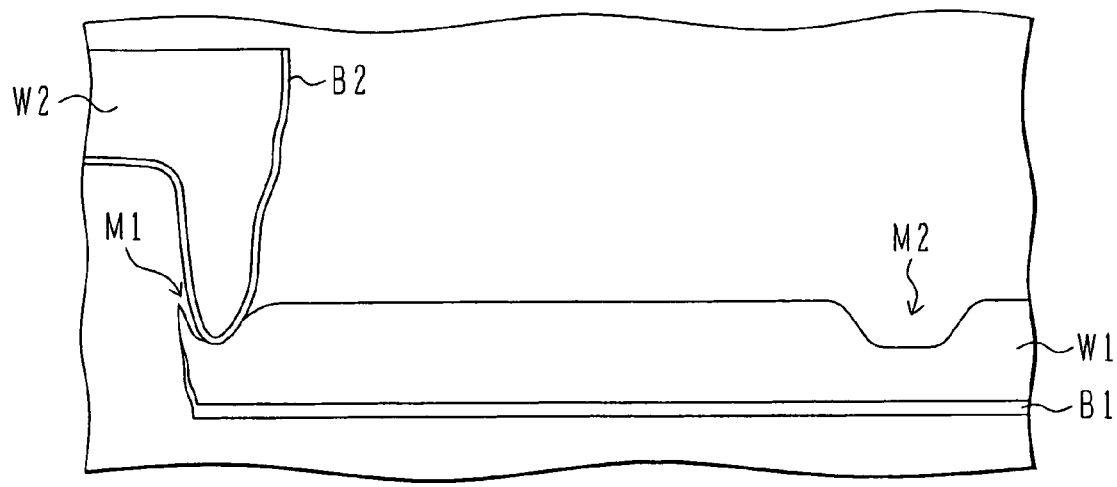
FIGS. 9A-9C are a sketch and a cross sectional view illustrating the experiments made by the present inventor.

FIG. 9A is a sketch of a transmission electron microscope (TEM) photograph of a sample used by the experiments. A lower level wiring is made of a barrier metal layer B1 and a copper wiring layer W1, and an upper level wiring connected to the end portion of the copper wiring layer W1 is made of a barrier metal layer B2 and a copper wiring layer W2. An insulating copper diffusion preventing layer is formed on the upper surface of each wiring. The direction along which current flowed into the wirings is a direction that electrons are supplied from the upper level wiring to lower level wiring. A small void M1 is formed in the lower level copper wiring W1 in the contact area with the upper level wiring, and a large void M2 is formed in a middle area of the wiring.

Figure 9B:
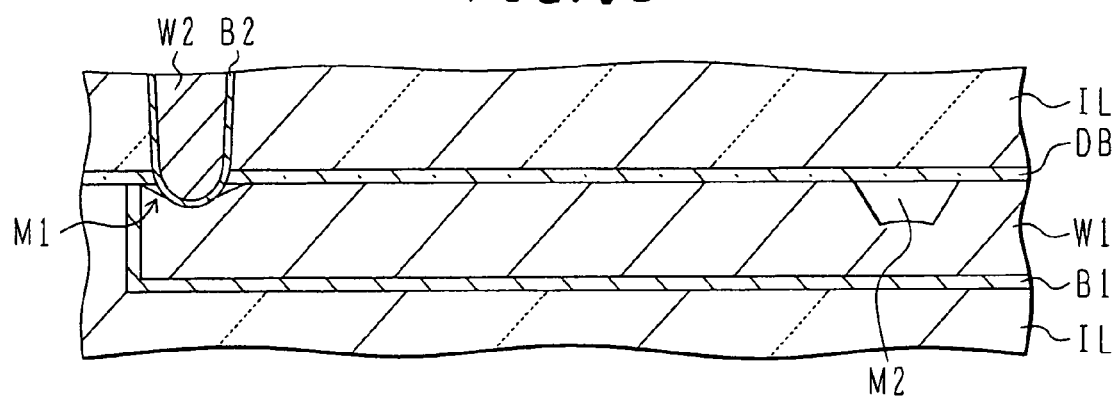

FIG. 9B is a schematic cross sectional view showing the structure of the lower level wiring layer shown in FIG. 9A. The lower level wiring is formed in an interlayer insulating film IL. An insulating copper diffusion preventing layer DB made of SiN is disposed on the surface of the lower level copper wiring layer W1. The voids M1 and M2 are formed in contact with the interface between the lower level copper wiring layer W1 and insulating copper diffusion preventing layer DB.

It can be seen that the voids are formed starting from the interface between the copper wiring layer and insulating copper diffusion preventing layer. No void is formed at the interface between the barrier metal layer and the copper wiring layer formed thereon.

It is conceivable from these experiment results that although the barrier metal layer and copper wiring layer form a good interface, the insulating copper diffusion preventing layer and copper wiring layer cannot form a good interface and has poor tight contact so that copper atoms at the interface are likely to move and interface diffusion is likely to occur. It is conceivable that as the interface diffusion of copper atoms at the interface with the insulating copper diffusion preventing layer starts, copper atoms are subjected to volume motion and if copper atoms under volume motion become insufficient, a void is formed.

Although the void M1 is formed in the lower level copper wiring layer W1 contacting the barrier layer B2 of the upper level wiring layer, it is not grown in the adjacent upper level copper wiring layer W2 with the barrier metal layer B2 being interposed therebetween. This suggests that as a void is formed in the copper wiring layer, it grows in the continuous copper wiring layer although the void does not grow by breaking the barrier metal layer.

By utilizing this phenomenon, the growth of a void can be expected to be suppressed. Namely, the growth of a void is expected to be stopped by the barrier metal layer by forming a barrier metal layer in the copper wiring layer.

Embodiments of the present invention will be described hereunder with reference to the accompanying drawings.

FIG. 1A to 1E are schematic diagrams illustrating a method of manufacturing a semiconductor device according to the first embodiment of the present invention.

Figure 1A:
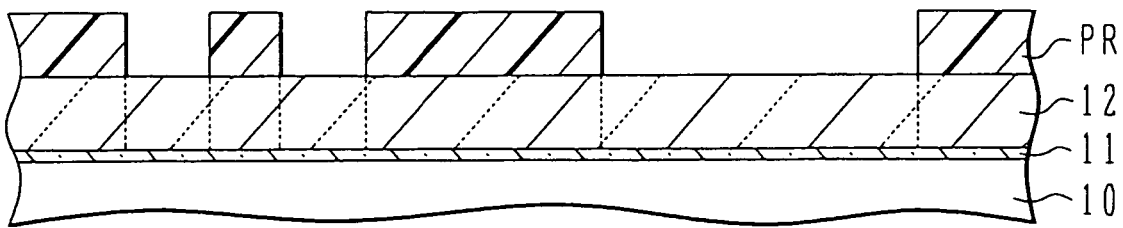
FIGS. 1A to 1E are cross sectional views illustrating a method of manufacturing a semiconductor device according to an embodiment of the present invention.

As shown in FIG. 1A, on an underlie 10 including semiconductor elements, an insulating copper diffusion preventing layer 11 and an interlayer insulating layer 12 are laminated. For example, the copper diffusion preventing layer 11 is an SiN layer having a thickness of 50 nm, and the interlayer insulating layer 12 is a silicon oxide layer having a thickness of 500 nm. A photoresist pattern PR is formed on the silicon oxide layer 12, having openings corresponding in shape to wiring trenches.

By using the photoresist pattern PR as an etching mask, the silicon oxide layer 12 is etched. The silicon nitride layer 11 functions as an etch stopper. The photoresist pattern PR is thereafter removed by ashing or the like. Even if elements easy to be oxidized, such as a copper wiring, exist under the silicon nitride layer 11, oxidation is prevented by the silicon nitride layer 11.

Figure 1B:
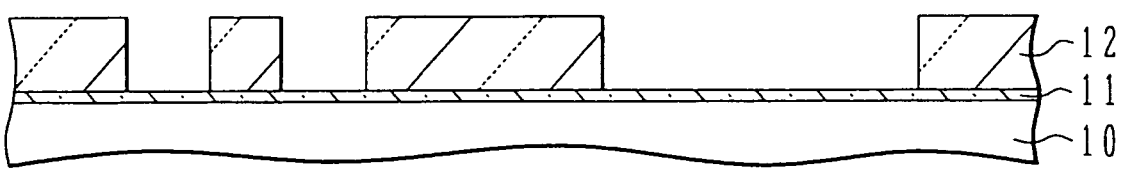

FIG. 1B shows the state that the silicon oxide layer 12 was etched and the photoresist pattern PR was removed. The silicon nitride layer 11 is exposed in the openings. In this state, by using the silicon oxide layer 12 as an etching mask, the silicon nitride layer 11 exposed in the openings is etched. For example, the silicon nitride layer 11 is etched by plasm using CF-containing gas or the like.

Figure 1C:
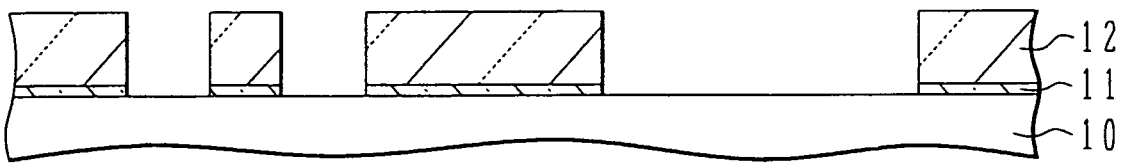

FIG. 1C shows the state that the etching the silicon nitride layer 11 was completed. The wiring trenches are formed through the silicon oxide layer 12 and silicon nitride layer 11. If a conductive plug and the like is formed in the underlie 10, these contact areas are exposed in the openings formed through the silicon oxide layer 12 and silicon nitride layer 11.

Figure 1D:
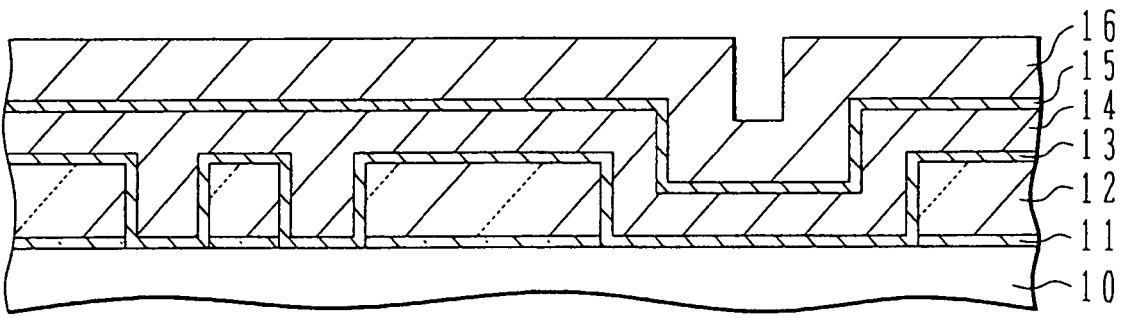

As shown in FIG. 1D, a barrier metal layer 13 and a copper wiring layer 14 are formed on the insulating layer with the wiring trenches. For example, the barrier metal layer 13 is made of a Ta layer having a thickness of 50 nm formed by sputtering, and the copper wiring layer 14 having a thickness of about 250 nm is formed by forming a seed copper layer by sputtering and plating a copper layer. Therefore, the barrier metal layer 13 having a thickness of 50 nm and the copper wiring layer 14 having a thickness of 250 nm are formed in the trenches having a thickness of 550 nm formed in the lamination of the silicon nitride layer 11 having the thickness of 50 nm and the silicon oxide layer 12 having the thickness of 500 nm, so that the trenches are buried to a half the depth or more with the barrier metal layer 13 and copper wiring layer 14.

The trench having a narrow width is buried fully with the copper layer 14 because plating progresses in a narrow opening with a priority over other openings. The surface of the copper layer 14 having the thickness of 250 nm is at a position lower by 250 nm than the surface of the silicon oxide layer 12 having the thickness of 500 nm.

Another barrier metal layer 15 is formed on the copper wiring layer 14, and a copper wiring layer 16 is grown on the barrier metal layer 15. For example, a Ta layer 15 having a thickness of 50 nm is formed by sputtering and thereafter a copper layer 16 having a thickness of 800 nm is formed by plating. Since the trench has a depth of 550 nm, a recess having a depth of about 550 nm is also formed on the surface of the copper wiring layer 16.

In the state shown in FIG. 1D, CMP is performed to completely remove the copper layer and barrier layer deposited on and above the silicon oxide layer 14. During this CMP, the upper surface in contact with the polishing plane is subjected to both mechanical polishing and chemical polishing. The inside of the recess not in contact with the polishing plane is subjected to only chemical polishing. Since the polishing speed in the inside of the recess is slow, the irregular surface of the copper layer 16 is removed during CMP and a flat surface appears.

Figure 1E:
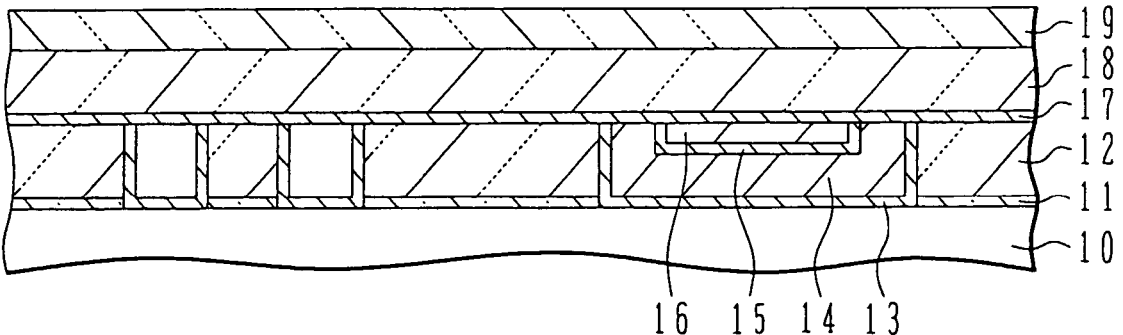

As shown in FIG. 1E, CMP continues until the metal layer on the silicon oxide layer 12 is completely removed and the surface of the copper layer 16 becomes approximately flush with the surface of the silicon oxide layer 12. If CMP is stopped when the surface of the silicon oxide layer 12 is exposed, an auxiliary copper wiring layer has a thickness of 200 nm. If over-polishing is performed, the thickness of the auxiliary copper wiring layer is further thinned.

On the planarized surface, an insulating copper diffusion preventing layer 17 such as silicon nitride is formed, and on this layer 17, an insulting layer 18 such as silicon oxide and a protective layer 19 such as silicon nitride are formed. If an upper level wiring layer is to be further formed, the growth of the protective layer 19 is omitted.

The wider wiring on the right side is made of a lamination of the barrier metal layer 13, the copper wiring layer 14, an auxiliary barrier metal layer 15 and the auxiliary copper wiring layer 16, in this order from the bottom. The insulating copper diffusion preventing layer 17 contacts the auxiliary copper wiring layer 16 and does not contact the copper wiring layer 14 in the main portion of the wiring upper surface excluding the peripheral wiring upper surface.

The insulating copper diffusion preventing layer 17 contacts the copper wiring layer 14 only in a limited area of the peripheral wiring upper surface. Even if a void is formed in the auxiliary copper wiring layer 16 due to electromigration of copper atoms, the void is expected to be confined by the auxiliary barrier metal layer 15.

Although the copper wiring layer 14 contacts the insulating copper diffusion preventing layer 17 in the peripheral limited area, the upper and lower main portions are surrounded by the barrier metal layers 13 and 15, so that a void is hard to be formed. It is therefore possible to suppress defects to be caused by voids and to increase a current density of a wide wiring.

Figure 9C:
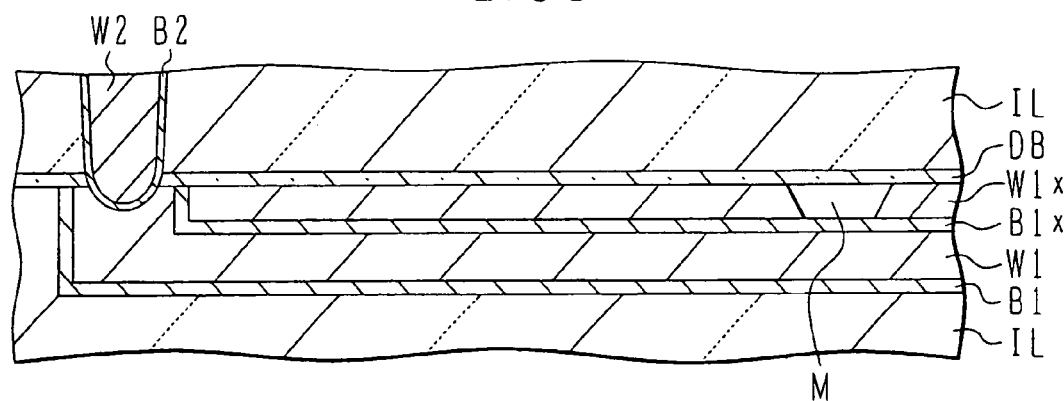

FIG. 9C is a schematic cross sectional view illustrating an expected function. A wiring pattern is formed in an interlayer insulating film IL, the wiring pattern being constituted of a barrier metal layer B1, a copper wiring layer W1, an auxiliary barrier metal layer B1x and an auxiliary copper wiring layer W1x. One end of the wiring pattern is connected to a via portion of an upper level wiring constituted of a barrier metal layer B2 and a copper wiring layer W2. A copper diffusion preventing layer DB is formed on the upper surface of the wiring pattern.

A void M is formed by interface diffusion of copper atoms at the interface between the copper diffusion preventing layer DB and auxiliary copper wiring layer W1x and hence by the volume motion of copper atoms. Although the void M grows, its growth stops at the auxiliary barrier metal layer B1x. It is possible to suppress the growth of a void in the lower level copper wiring layer W1.

In the embodiment shown in FIGS. 1A to 1E, the auxiliary barrier metal layer 15 is not disposed on the narrow wiring layers, and it is disposed only on the wide wiring layer and the auxiliary copper wiring layer 16 is formed on the auxiliary barrier metal layer. If a void is formed in the narrow wiring, defects occur. By adjusting the manufacture conditions, the auxiliary barrier metal layer can be disposed also on the narrow wiring.

FIGS. 2A to 2D illustrate a method of manufacturing a semiconductor device according to the second embodiment of the present invention. Wiring trenches are formed through the insulating copper diffusion preventing layer 11 and interlayer insulating layer 12, by processes similar to those described with FIGS. 1A to 1C.

Figure 2A:
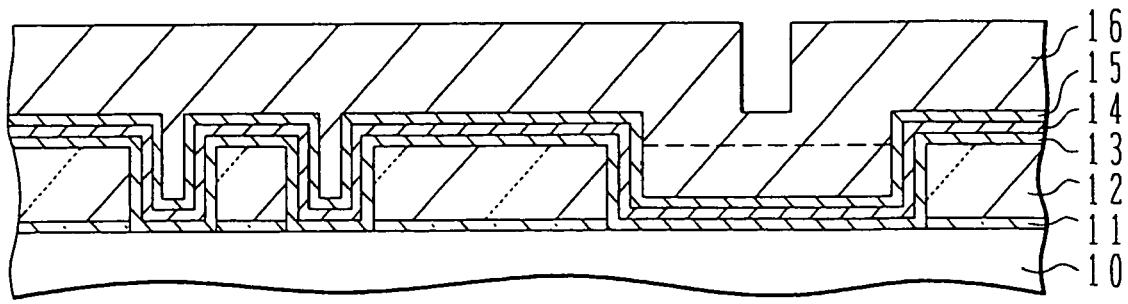
FIGS. 2A to 2D are cross sectional views illustrating a method of manufacturing a semiconductor device according to another embodiment of the present invention.

As shown in FIG. 2A, a barrier metal layer 13 is formed on the surface of the semiconductor substrate having wiring trenches, and thereafter a copper wiring layer 14 is formed by chemical vapor deposition (CVD). Since CVD provides an isotropic growth, the copper wiring layer 14 having a uniform thickness can be formed on the barrier metal layer 13. A thickness of the copper wiring layer 14 is selected in such a manner that a hollow portion is left not only in the wide wiring trench but also in the narrow wiring trench.

An auxiliary barrier metal layer 15 is formed on the copper wiring layer 14, and an auxiliary copper wiring layer 16 is formed on the auxiliary barrier metal layer 15. CMP is performed thereafter to completely remove the metal layer on the silicon oxide layer 12.

Figure 2B:
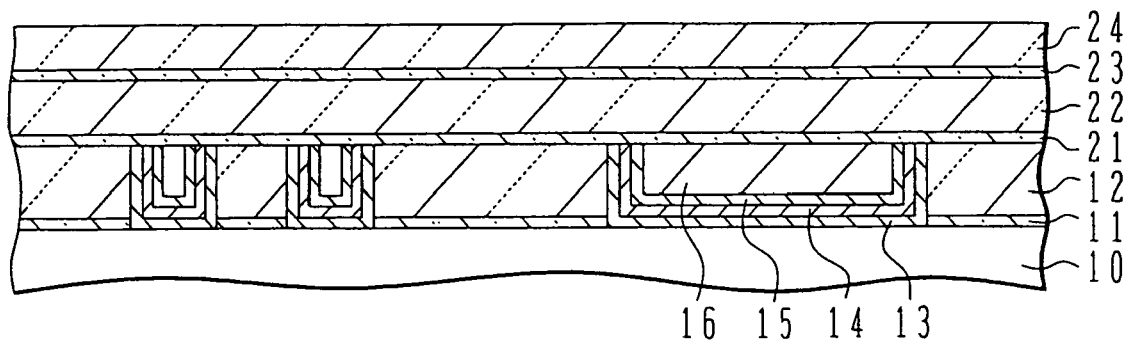

As shown in FIG. 2B, wirings are therefore formed which have the auxiliary barrier metal layer 15 and auxiliary wiring layer 16 buried not only in the wide wiring trench but also in the narrow wiring trenches. In the second embodiment, the thickness of the copper wiring layer 14 is made uniform and thin and the auxiliary barrier metal layer 15 and auxiliary wiring layer 16 are formed also in the narrow wiring trenches. Breakage of a wiring to be caused by a void can be suppressed in both the narrow and wide wirings. In the following, description will be made on a process of forming a dual damascene wiring in an upper layer.

Grown on the CMP-ed surface are an insulating copper diffusion preventing layer 21 such as silicon nitride, an insulating layer 22 such as silicon oxide, an etch stopper layer 23 such as silicon nitride and an insulating layer 24 such as silicon oxide. These laminated insulating layers constitute an interlayer insulating layer for one wiring layer. The silicon nitride layer 23 and silicon oxide layer 24 constitute a wiring pattern insulating layer.

Figure 2C:
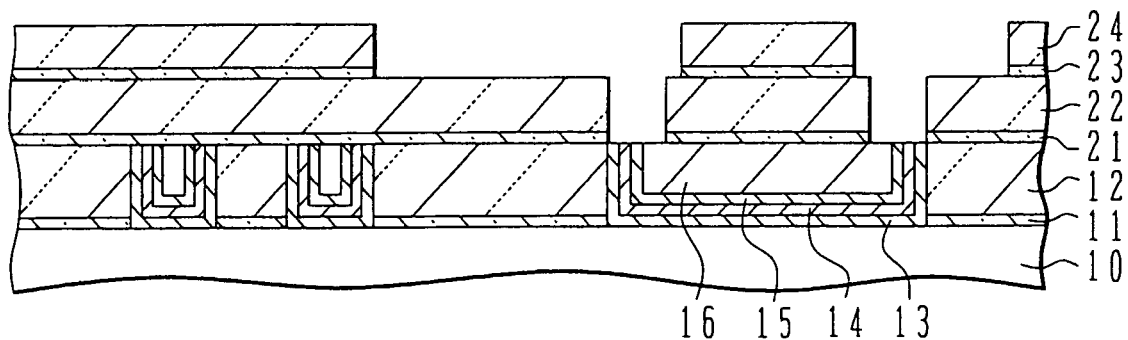

As shown in FIG. 2C, wiring pattern trenches are formed through the insulating layers 23 and 24 and via holes are formed through the insulating layers 22 and 21, to thereby form dual damascene recesses. As a method of forming a dual damascene recess, any one of the methods may be used: a well-known method whereby a via hole is first formed and then a wiring pattern trench is formed; and a well-known method whereby a wiring pattern trench is first formed and then a via hole is formed.

Figure 2D:
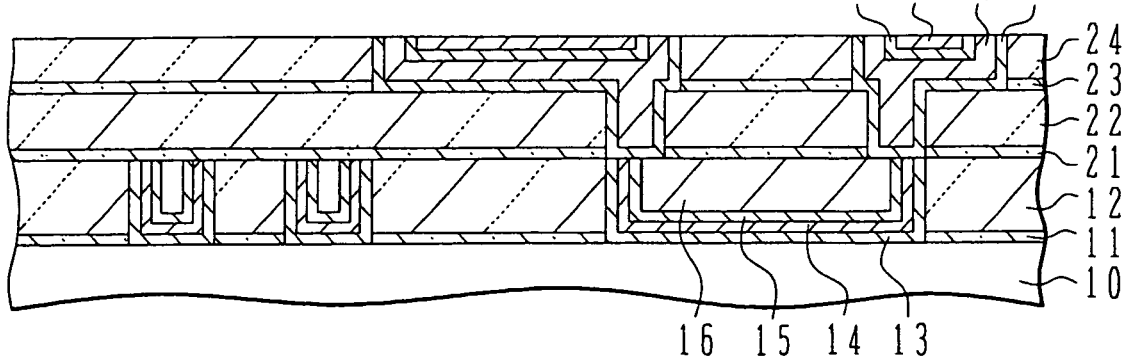

As shown in FIG. 2D, a barrier metal layer 25, a copper wiring layer 26, an auxiliary barrier metal layer 27 and an auxiliary copper wiring layer 28 are formed and buried in the dual damascene recesses. CMP is performed to remove the metal layer on the laminated insulated layer and complete dual damascene wirings.

Since the diameter of a via hole is generally designed small, the inside of the via hole is buried with the barrier metal layer 25 and copper wiring layer 26 or only with the barrier metal layer 25. Since the via conductor does not contact the insulating copper diffusion preventing film, there is no substantial demerit even if the auxiliary barrier metal layer 25 is not contained in the via conductor. The auxiliary barrier metal layer 27 and auxiliary copper wiring layer 28 are formed only in the wiring pattern.

According to the structures shown in FIGS. 1E and 2D, in the wiring main portions, although the insulating copper diffusion preventing layers 17 and 21 contact the auxiliary copper wiring layer 16, they do not contact the wiring layer 13 because the wiring layer 13 is separated by the auxiliary barrier metal layer. Even if a void is formed by interface diffusion at the interface between the auxiliary copper wiring layer 16 and the insulating copper diffusion preventing layers 17 and 21, the void is inside the auxiliary copper wiring layer 16 and its growth is stopped by the auxiliary barrier metal layer 15, so that invasion of the void into the wiring layer 13 can be prevented.

The auxiliary copper wiring layer defines a range in which a void is allowed to be formed and grown. The copper wiring layer separated from the auxiliary copper wiring layer by the auxiliary barrier metal layer has a contact area with the copper diffusion preventing layer limited only to the peripheral area of the copper wiring layer, and has the main portion where a void is suppressed from being formed.

The smaller the volume ratio of the auxiliary copper wiring layer to the copper wiring layer, the larger the cross sectional area of the copper wiring where the formation of voids is suppressed. It is preferable from this view point that the auxiliary barrier metal layer and auxiliary copper wiring layer are formed shallow, e.g., a half or shallower than the depth of the wiring trench. This thickness limitation can be preformed more easily if the auxiliary barrier metal layer and auxiliary copper wiring layer are formed only for the wide wiring.

In the above-described embodiments, SiN is used as the material of the insulating copper diffusion preventing layer and etch stopper layer, and silicon oxide is used as the material of the insulating layer. Various other insulating layers may also be used.

Figure 3A:
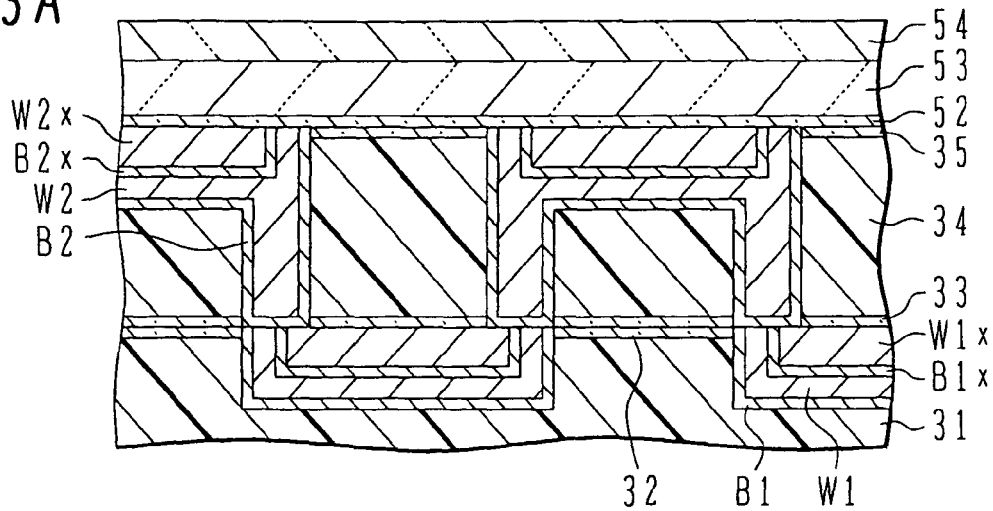
FIGS. 3A to 3C are cross sectional views showing examples of a laminated insulating layer of multi-layer wirings.
Figure 3B:
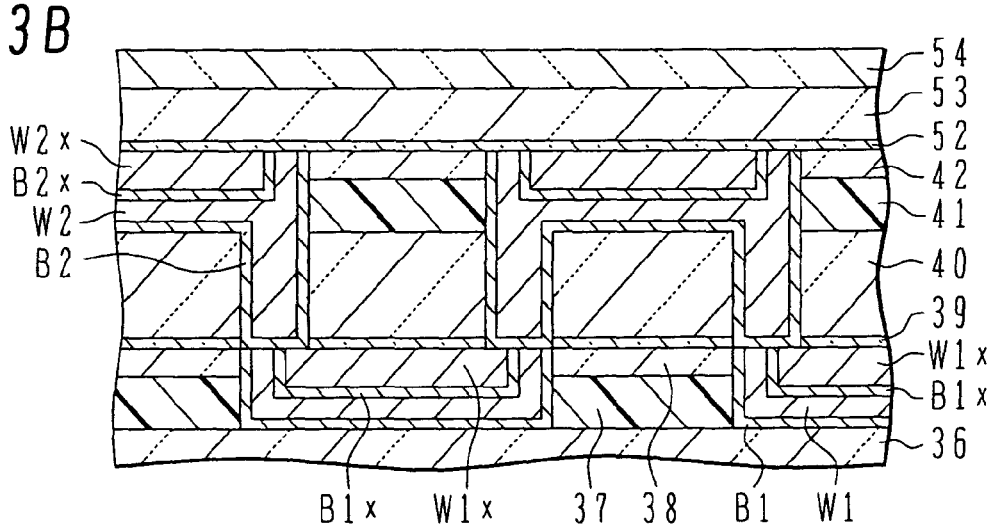
Figure 3C:
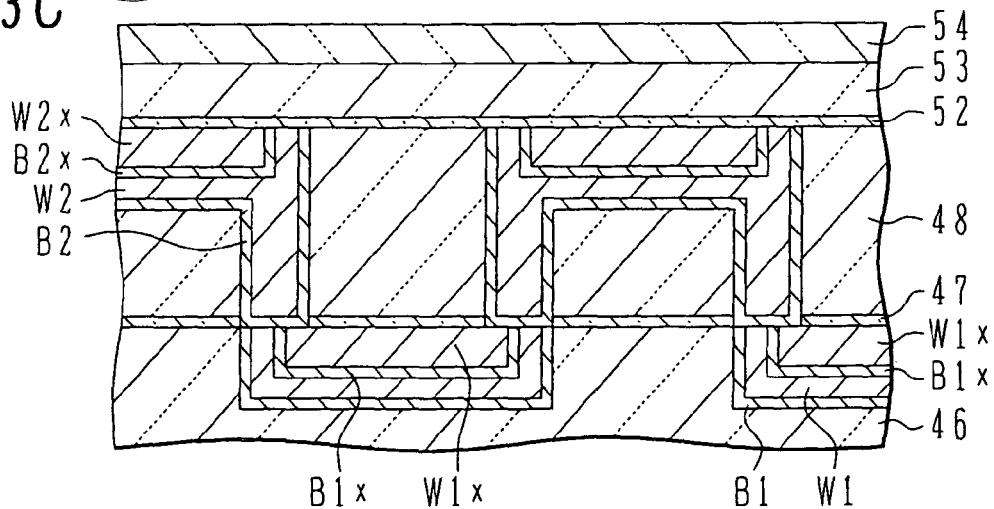

FIGS. 3A, 3B and 3C show examples of insulated lamination structures made of different materials.

In FIG. 3A, a hard mask layer 32 of SiC is stacked on an organic insulating layer 31 of SiLK (trademark of the Dow Chemical Company) or the like, to form an interlayer insulating layer for a lower level wiring. A copper wiring pattern is buried in this interlayer insulating layer, the copper wiring layer being constituted of a barrier metal layer B1, a copper wiring layer W1, an auxiliary barrier metal layer B1$x$ and an auxiliary copper wiring layer W1$x$. The copper wiring pattern may be the pattern of either the first embodiment or second embodiment.

Laminated on the copper wiring pattern are a copper diffusion preventing and etch stopping layer 33 of SiC, an organic insulating layer 34, and a hard mask layer 35 of SiC, forming an interlayer insulating film for an upper level wiring. A dual damascene upper level wiring having a via portion and a wiring portion is formed through the interlayer insulating layer, by using a barrier metal layer B2, a copper wiring layer W2, an auxiliary barrier metal layer B2$x$ and an auxiliary copper wiring layer W2$x$. Formed on the upper level wiring are a copper diffusion preventing layer 52 of SiC, an insulating layer 53 of SiO$_2$ or the like and a protective layer 54 of SiN or the like.

In FIG. 3B, an interlayer insulating film for a lower level wiring is made of a silicon oxide layer 36, an organic insulating layer 37 and a silicon oxide layer 38. In this insulating lamination layer, a lower level copper wiring like the above-described wiring is buried.

An interlayer insulating film for an upper level wiring is made of a copper diffusion preventing layer 39 of SiN or the like, a silicon oxide layer 40, an organic insulating layer 41 and a silicon oxide layer 42. In this insulating lamination layer, an upper level dual damascene wiring like the above-described wiring is buried.

The interlayer insulating structure improves the safety of processes by sandwiching the organic insulating layer by the silicon oxide layers, while lowering the effective dielectric constant by using the organic insulating layer. The insulating films above the upper level wiring have the structure similar to that shown in FIG. 3A. The organic insulating film and a silicon oxide film have different etching characteristics. By using this difference between etching characteristics, etching can be controlled more easily.

In FIG. 3C, an interlayer insulating film for the lower level wiring is constituted of a silicon fluoride oxide (SiOF or FSG) layer 46. In this insulating layer, a lower level copper wiring like the wiring described above is buried. An interlayer insulating film for an upper level wiring is constituted of an insulating copper diffusion preventing layer 47 of SiN or the like and a silicon fluoride oxide layer 48. In this laminated insulating layer, an upper level dual damascene wiring like the wiring described above is buried.

As the material of the barrier metal layer, Ta, TiN, TaN or the like may be used. However, in the structure of FIG. 3C using silicon fluoride oxide, as the material of the barrier metal layers B1 and B2 disposed on the silicon fluoride oxide layers, it is preferable to use TiN or TaN other than Ta.

FIGS. 4A, 4B and 4C show contact areas between the upper level and lower level wirings, using the structure shown in FIG. 3B by way of example.

Reference symbols identical to those shown in FIG. 3B indicate similar components.

In FIG. 4A, the via portion B2, W2 of the upper level wiring forms a contact in the region from the barrier metal layer B1 to the copper wiring layer W1, auxiliary barrier metal layer B1$x$ and auxiliary copper wiring layer W1$x$ of the lower level wiring. This structure is similar to that shown in FIG. 3B. The via portion of the upper level wiring contacts not only the copper wiring layer W1 but also the auxiliary copper wiring layer W1$x$.

In FIG. 4B, the via portion of the upper level wiring forms a contact only at the upper surfaces of the barrier metal layer B1, copper wiring layer W1 and auxiliary barrier metal layer B1$x$ of the lower level wiring. The via portion B2 and W2 of the upper level wiring does not contact the auxiliary copper wiring W1$x$ although it contacts the copper wiring layer W1.

In FIG. 4C, the via portion B2, W2 of the upper level wiring forms a contact only at the upper surfaces of the barrier layer B1 and copper wiring layer W1 of the lower level wiring. The via portion B2, W2 of the upper level wiring does not traverse the copper wiring layer W1 but has a region, between the via portion and auxiliary barrier metal layer B1$x$, where the copper wiring layer W1 contacts the copper diffusion preventing layer 39.

Any one of these contact structures can be selected in accordance with the conditions and necessity.

Figure 5A:
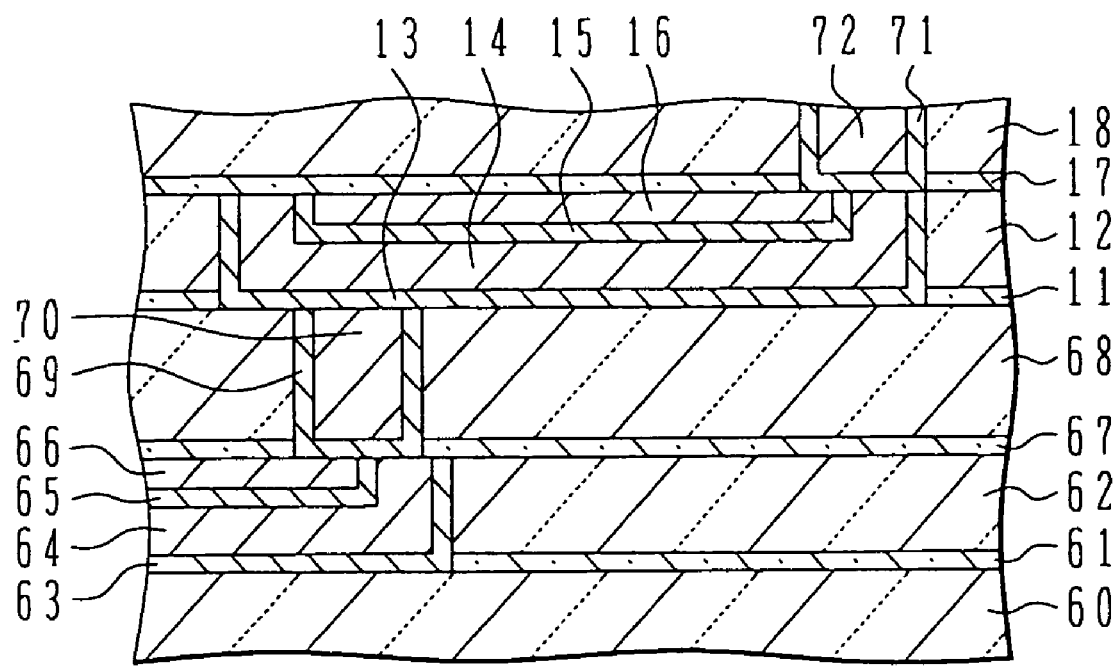
FIGS. 5A and 5B are cross sectional views of a semiconductor device according to other embodiments of the present invention.

FIG. 5A shows an example of the structure of a semiconductor device having a single damascene structure whose via portion and wiring pattern portion are formed by separate processes. On an underlying insulating layer 60, an etch stopper layer 61 such as SiN and a silicon oxide layer 62 are formed to form an interlayer insulating film for a lower level wiring. A lower level wiring pattern is buried in this interlayer insulating film, the wiring pattern being constituted of a barrier metal layer 63, a copper wiring layer 64, an auxiliary barrier metal layer 65 and an auxiliary copper wiring layer 66.

On the lower level wiring layer, an etch stopper layer 67 and a silicon oxide layer 68 are laminated, and in this laminated layer, a via portion of an upper level wiring is buried. The via portion is constituted of only a barrier metal layer 69 and a copper wiring layer 70. A wiring pattern insulating layer made of an etch stopper layer 11 and a silicon oxide layer 12 is formed on the via portion. In this insulating layer, a wiring pattern is buried which is constituted of a barrier metal layer 13, a copper wiring layer 14, an auxiliary barrier metal layer 15 and an auxiliary copper wiring layer 16.

The upper surface of the wiring pattern is covered with an etch stopper layer 17 such as SiN, a silicon oxide layer 18 is formed on the etch stopper layer 17, and a via portion of the upper level wiring made of a barrier metal layer 71 and a copper wiring layer 72 is buried.

In the single damascene structure, the copper wiring layer 70 of the via portion is covered with the barrier metal layer 13 of the wiring pattern and does not contact the copper diffusion preventing layer (etch stopper layer) 11, 17. The copper wiring layer 14 of the wiring pattern contacting the copper diffusion layer 17 is separated from the copper wiring layer 70 of the via portion by the barrier metal layer 13. Therefore, the auxiliary barrier metal layer is not necessary to be formed in the via portion.

Figure 5B:
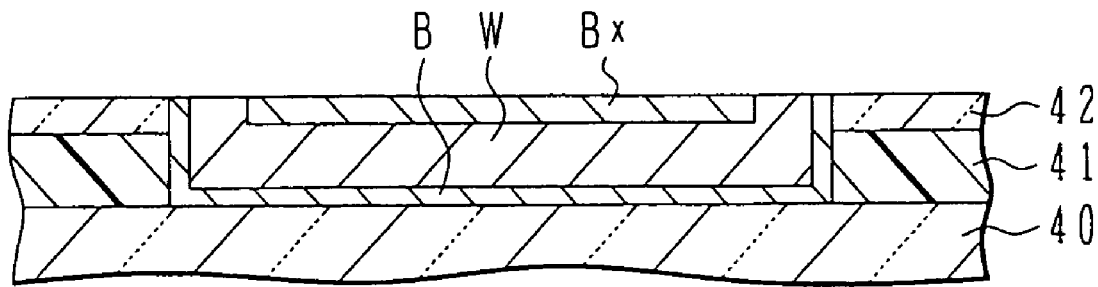

FIG. 5B shows an example of a modification of the wiring pattern. On an underlying insulating layer 40, an interlayer insulating film is formed having, for example, an organic insulating layer 41 and a silicon oxide layer 42. A wiring pattern is buried in this interlayer insulating layer, the wiring pattern being constituted of a barrier metal layer B, a copper wiring layer W and an auxiliary barrier metal layer Bx. On the wiring pattern, an insulating copper diffusion preventing layer is formed. The auxiliary barrier metal layer is separated from the barrier metal layer.

In this structure, the auxiliary copper wiring layer is not formed above the auxiliary barrier metal layer Bx. Since the auxiliary barrier metal layer Bx is formed on the main portion of the copper wiring layer W, the contact area between the copper wiring layer W and insulating copper diffusion layer is limited, so that a void is suppressed from being formed. It is preferable that a thickness of the auxiliary barrier metal layer Bx is selected so as not to be removed by CMP.

Figure 6A:
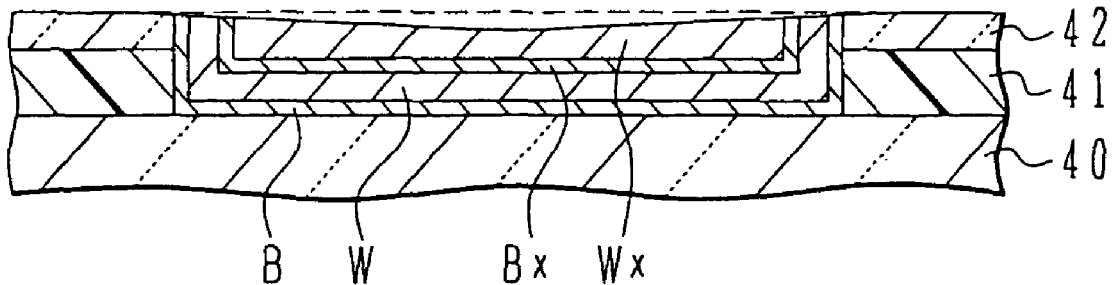
FIGS. 6A to 6C are cross sectional views showing structures formed under different CMP conditions.
Figure 6B:
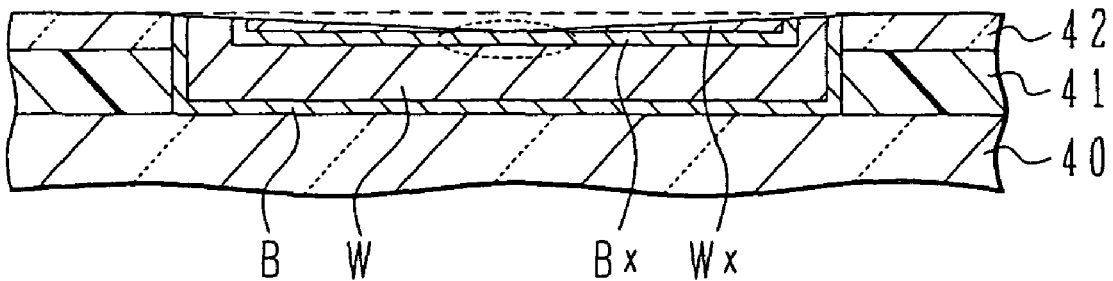
Figure 6C:
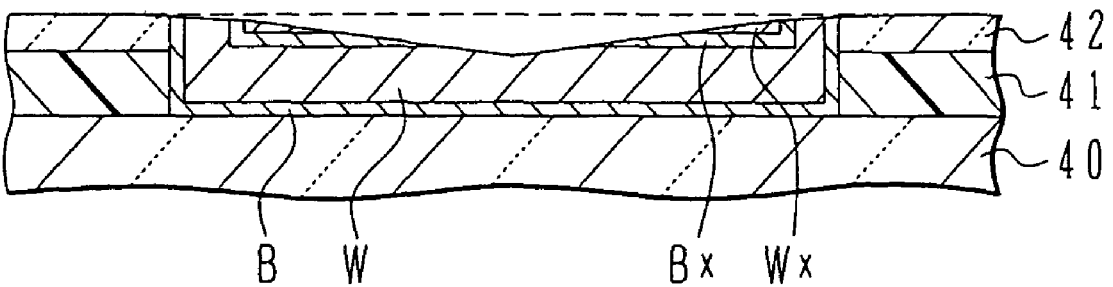

FIGS. 6A, 6B and 6C show the structures of a wide wiring having dishing and corrosion.

In FIG. 6A, a wiring pattern is buried in an insulating lamination structure made of a silicon oxide layer 40, an organic insulating layer 41 and a silicon oxide layer 42. The wiring pattern is made of a barrier metal layer B, a copper wiring layer W, an auxiliary barrier metal layer Bx and an auxiliary copper wiring layer Wx similar to any one of the first and second embodiments. If dishing and erosion occur during CMP for forming a wiring pattern, the upper surface of the wiring pattern gradually lowers toward the central area.

FIG. 6B shows the case that the degree of dishing and erosion is stronger. The upper surface of the wiring layer reaches the auxiliary barrier metal layer Bx in the central area. Even in this state, a void is suppressed from being formed, because the main portion of the copper wiring layer W does not contact the insulating copper diffusion preventing layer. The structure shown in FIG. 5B may be combined with any one of the first and second embodiments.

FIG. 6C shows the case that the degree of dishing and erosion is much stronger. The central areas of the auxiliary barrier metal Bx and auxiliary copper wiring layer Wx are removed by dishing and erosion, and the copper wiring layer W is exposed.

Even in this state, the formation of voids can be suppressed in the area where the auxiliary barrier metal layer Bx is left, because a contact between the copper wiring layer W and insulating copper diffusion preventing layer is avoided.

Figure 7:
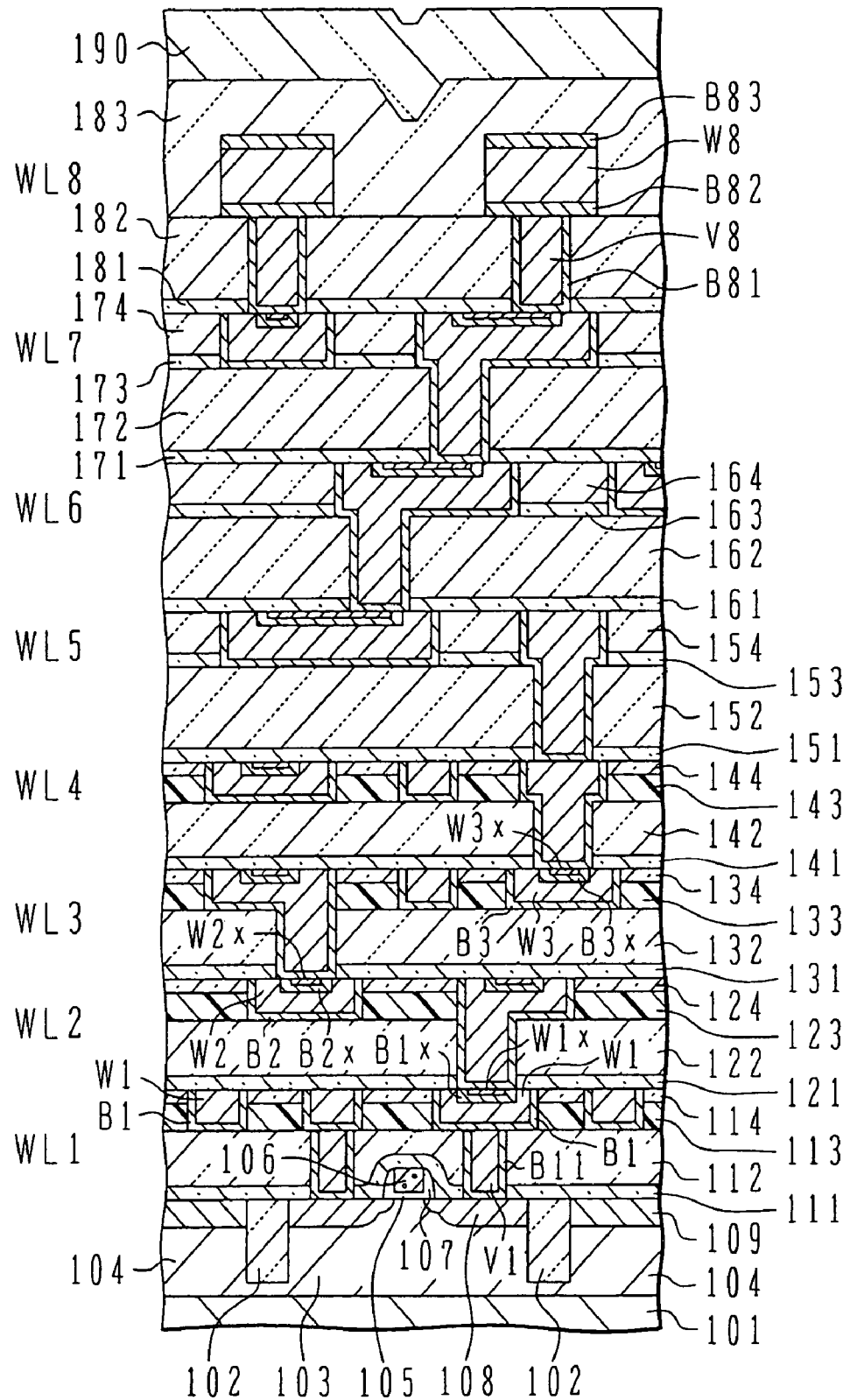
FIG. 7 is a cross sectional view showing an example of a semiconductor device having multi-layer wirings.

FIG. 7 shows an example of the structure of a semiconductor integrated circuit device having a multi-layer wiring structure. In a silicon substrate 101, an element isolation region is formed by shallow trench isolation (STI). In an active region surrounded by the element isolation region 102, a p-type well 103 and an n-type well 104 are formed to form MOS transistors.

A gate insulating film 105, a polysilicon gate electrode 106 and side wall spacers 107 are formed on and above the p-type well 103, and n-type source/drain regions 108 with extensions are formed in the p-type well on both sides of the gate electrode 106. In a n-type well 104, p-type source/drain regions 109 are formed.

A silicon nitride layer 111 is formed on the semiconductor substrate, covering the gate electrode. A phosphosilicate glass (PSG, phosphorus-doped silicon oxide) layer 112 is formed on the silicon nitride layer 111. A via conductor made of a barrier metal layer B11 and a tungsten layer V1 is formed through the PSG layer 112 and silicon nitride layer 111.

On the PSG layer 112, an organic insulating layer 113 and a silicon oxide layer 114 are laminated. In this lamination, a wiring pattern is buried which is constituted of a barrier metal layer B1, a copper wiring layer W1, an auxiliary barrier metal layer B1x and an auxiliary copper wiring layer W1x. A first wiring layer WL1 is formed in this manner.

On the first wiring layer WL1, a lamination is formed which is constituted of a silicon nitride layer 121, a silicon oxide layer 122, an organic insulating layer 123 and a silicon oxide layer 124, to form an interlayer insulating film for a second wiring layer WL2. A second wiring layer WL2 is buried in the second wiring interlayer insulating film, the second wiring layer being constituted of a barrier metal layer B2, a copper wiring layer W2, an auxiliary barrier metal layer B2x and an auxiliary copper wiring layer W2x.

Similar to the interlayer insulating film for the second wiring WL2, third and fourth wiring layers WL3 and WL4 are made of lamination structures of silicon nitride layers 131 and 141, silicon oxide layers 132 and 142, organic insulating layers 133 and 143 and silicon oxide layers 134 and 144.

The damascene wiring structures of the third and fourth wiring layers WL3 and WL4 are similar to that of the second wiring layer. The wiring pattern is constituted of a barrier metal layer Bn, a copper wiring layer Wn, an auxiliary barrier metal layer Bnx and an auxiliary copper wiring layer Wnx.

Fifth to seventh wiring layers WL5 to WL7 have the structure different from that of the second to fourth wiring layers WL2 to WL4. An interlayer insulating film for the fifth wiring layer WL5 is made of a lamination of a silicon nitride layer 151, a silicon oxide layer 152, a silicon nitride layer 153 and a silicon oxide layer 154. The structure of the wiring pattern is similar to that of the second to fourth wirings WL2 to WL4.

Similar to the fifth wiring layer WL5, interlayer insulating films for the sixth and seventh wiring layers are also made of silicon nitride layers 161 and 171, silicon oxide layers 162 and 172, silicon nitride layers 163 and 173 and silicon oxide layers 164 and 174. The structure of the wiring pattern is similar to that of the fifth wiring WL5.

The upper level wiring has a broad pitch between wiring lines and a small wiring density. There is therefore less necessity of using a low dielectric constant insulating layer which is used to lower parasitic capacitance between wiring lines.

The uppermost eighth wiring layer WL8 has a special structure. A lower level insulating layer is made of a silicon nitride layer 181 and a silicon oxide layer 182, and a via portion is made of a barrier metal layer B81 and a tungsten layer V8.

A wiring layer also used as pads is formed over the via portion, the wiring layer being made of a TiN layer B82, an aluminum layer W8 and a TiN layer B83. In place of aluminum, copper may be used. A silicon oxide layer 183 and a silicon nitride layer 190 are formed covering the uppermost eighth wiring.

In the structure shown in FIG. 7, the first to seventh wiring layers WL1 to WL7 have all the auxiliary barrier metal layer buried in the wiring pattern to suppress the formation of voids. The structures of the interlayer insulating films for upper level wiring layers are different, excepting the lower wiring layers and uppermost wiring layers.

Figure 8:
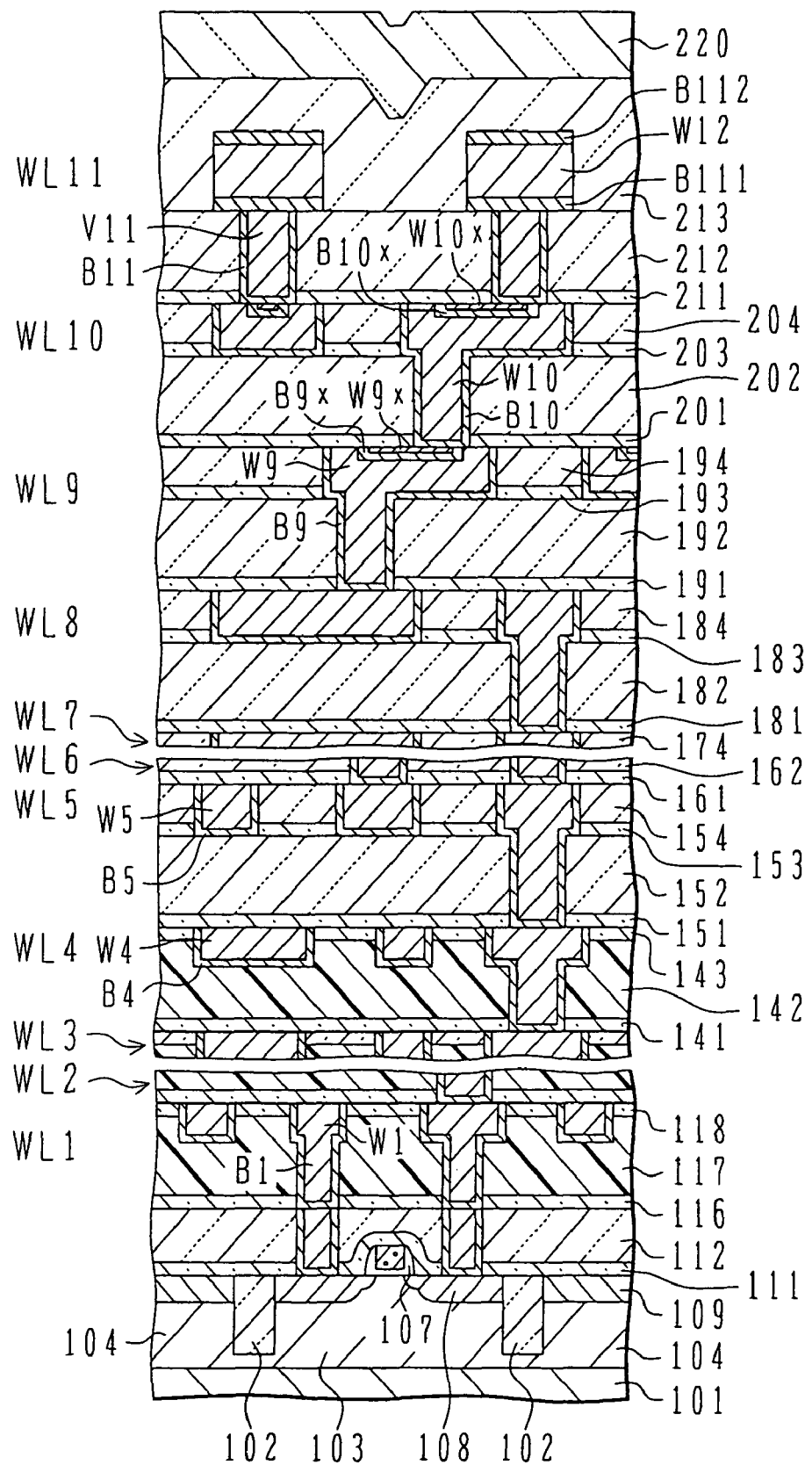
FIG. 8 is a cross sectional view showing another example of a semiconductor device having multi-layer wirings.

FIG. 8 shows another example of the structure of a semiconductor integrated circuit device having a multi-layer wiring structure. The structure of MOS transistors formed in a semiconductor substrate and the structure of a lead conductive plug for the source and drain are similar to those shown in FIG. 7.

On a PSG layer 112, a lamination is formed which is constituted of an SiC layer 116, an organic insulating layer 117 and an SiC layer 118, and a first wiring layer WL1 made of a copper wiring layer W1 is formed. An auxiliary barrier metal layer is not used.

Second to fourth wiring layers WL2 to WL4 have the structure similar to that of the first wiring layer WL1. Description will be made by using the fourth wiring layers WL4 by way of example. An interlayer insulating film is made of an SiC layer 141, an organic insulating layer 142 and an SiC layer 143. A dual damascene wiring is made of a barrier metal layer B4 and a copper layer W4, and an auxiliary barrier metal layer is not disposed.

Fifth to eighth wiring layers WL5 to WL8 have each a similar structure. Description will be made by using the fifth wiring layers WL5 by way of example. An interlayer insulating film is made of an SiC layer 151, a silicon oxycarbide (SiOC) layer 152, an SiC layer 153 and a silicon oxycarbide layer 154. A dual damascene wiring is made of a barrier metal layer B5 and a copper layer W5, and an auxiliary barrier metal layer is not disposed.

For a ninth wiring layer WL9, a dual damascene wiring is buried in an interlayer insulating film made of an SiC layer 191, a silicon oxide layer 192, an SiC layer 193 and a silicon oxide layer 194. The dual damascene wiring is made of a barrier metal layer B9, a copper wiring layer W9, an auxiliary barrier metal layer B9x and an auxiliary copper wiring layer W9x.

A tenth wiring layer WL10 has the structure similar to that of the ninth wiring layer WL9. A dual damascene wiring is buried in an interlayer insulating film made of an SiC layer 201, a silicon oxide layer 202, an SiC layer 203 and a silicon oxide layer 204. The dual damascene wiring is made of a barrier metal layer B10, a copper wiring layer W10, an auxiliary barrier metal layer B10x and an auxiliary copper wiring layer W10x.

The uppermost wiring layer WL11 has the structure similar to that of the uppermost wiring layer shown in FIG. 7. A SiC layer 211 and a silicon oxide layer 212 are laminated, and in this lamination, a via conductor made of a TiN barrier metal layer B11 and a W wiring layer W11 is buried. On and over the via conductor, a TiN layer B111, a main wiring layer W12 and the uppermost wiring layer also used as bonding pads are formed. The main wiring layer is made of aluminum or aluminum alloy containing copper. The uppermost wiring layer is made of an upper TiN barrier metal layer B112. A silicon oxide layer 213 and a silicon nitride layer 220 are formed covering the wiring layer.

In the structure shown in FIG. 8, the lamination structures of interlayer insulating films change at three steps from the lower to upper level layers, and the effective dielectric factor becomes lower at the lower layer. The lower level wirings have a high density, and it is preferable to lower a dielectric constant of an interlayer insulting film in order to reduce parasitic capacitance of wirings.

An auxiliary barrier metal layer and an auxiliary copper wiring layer are not disposed in the lower and middle level wiring layers, and they are disposed only in two upper level layers WL9 and WL10. Upper level wiring layers have a high percentage of power source wirings and are required to supply large current. As the wiring structure using the auxiliary barrier metal layer and auxiliary copper wiring layer is used for such wirings, it is possible to effectively suppress the formation of voids, and it is effective for prolong the life time of wirings.

The present invention has been described in connection with the preferred embodiments. The invention is not limited only to the above embodiments. It will be apparent to those skilled in the art that other various modifications, improvements, combinations, and the like can be made.

The present invention is applicable to various semiconductor devices having a copper wiring and an upper insulating copper diffusion preventing layer.

The invention claimed is:

1. A semiconductor device comprising:
a semiconductor substrate;
a plurality of interlayer insulating layers formed above said semiconductor substrate, and including a first interlayer insulating layer below an uppermost interlayer insulating layer;
a plurality of wiring layers including a first damascene wiring which is not an uppermost wiring layer and is buried in said first interlayer insulating layer, the first damascene wiring including:
a barrier metal layer defining a bottom and a side wall of said first damascene wiring and defining a first hollow portion inside said barrier metal layer;
a copper wiring layer disposed in said first hollow portion and defining a second hollow portion inside said copper wiring layer, the second hollow portion not contacting the barrier metal layer; and
an auxiliary barrier metal layer disposed in said second hollow portion and separated from said barrier metal layer and defining a third hollow portion inside the auxiliary barrier metal layer;
an auxiliary copper wiring layer filled in said third hollow portion;
wherein the plurality of interlayer insulation layers include an insulating copper diffusion preventing film disposed directly on said first damascene wiring and said first interlayer insulating layer, the insulating copper diffusion preventing film having a bottom surface directly contacting with the barrier metal layer, the copper wiring layer, the auxiliary barrier metal layer and the auxiliary copper wiring layer and;
an upper level via conductor disposed above said first damascene wiring, and contacting, through said insulating copper diffusion preventing film, directly with at least a top surface of the copper wiring layer of the first damascene wiring, and wherein said barrier metal layer, said auxiliary barrier metal layer and the insulating copper diffusion preventing film suppress diffusion of copper.

2. The semiconductor device according to claim 1, further comprising a second damascene wiring buried in said first interlayer insulating layer, having a width narrower than a width of said first damascene wiring, and including:
 a second barrier metal layer defining a bottom and a side wall of said second damascene wiring and defining a fourth hollow portion inside said second damascene wiring; and
 a continuous copper wiring layer filled in said fourth hollow portion, wherein said insulating copper diffusion preventing film is disposed directly on said first and second damascene wirings and said first interlayer insulating layer.

3. The semiconductor device according to claim 1, wherein said first damascene wiring is a dual damascene wiring including a via portion for connection to an underlying wiring and a wiring pattern portion extending in-plane, and said auxiliary barrier metal layer and said auxiliary copper wiring layer are disposed only in said wiring pattern portion.

4. The semiconductor device according to claim 1, wherein said barrier metal layer and said auxiliary barrier metal layer are made of any one of Ta, TiN and TaN.

5. The semiconductor device according to claim 1, wherein said first damascene wiring has a wiring pattern extending in-plane and said auxiliary barrier metal layer is disposed at a position higher than a half depth of the wiring pattern.

6. The semiconductor device according to claim 1, wherein a top surface of the barrier metal layer, a top surface of the copper wiring layer, a top surface of the auxiliary barrier metal layer, and a top surface of the auxiliary copper wiring layer are flush with a top surface of the first interlayer insulating layer.

7. The semiconductor device according to claim 1, wherein said upper level via conductor contacts a portion of said copper wiring layer and a portion of said auxiliary barrier metal layer.

8. The semiconductor device according to claim 7, wherein said upper level via conductor contacts a portion of said auxiliary copper wiring.

9. The semiconductor device according to claim 1, wherein said first interlayer insulating layer, said barrier metal layer, said copper wiring layer, said auxiliary barrier metal layer, and said auxiliary copper wiring layer have a common flat surface.

10. A semiconductor integrated circuit device comprising:
 a semiconductor substrate formed with a number of semiconductor elements;
 laminated interlayer insulating layers formed on said semiconductor substrate;
 multi-layer wiring disposed in said laminated interlayer insulating layers, and including a plurality of lower level wiring layers and a plurality of upper level wiring layers, each wiring layer including a wiring pattern for intra-layer connection and a via for inter-layer connection, and at least one of the upper level wiring layers, which is not an uppermost wiring layer of the multi-layer wiring, including a first damascene wiring buried in a first interlayer insulating layer among said laminated interlayer insulating layers, said first damascene wiring including:
 a barrier metal layer defining a bottom and a side wall of said first damascene wiring and defining a first hollow portion inside said barrier metal layer;
 a copper wiring layer disposed in said first hollow portion and defining a second hollow portion inside said copper wiring layer, the second hollow portion not contacting the barrier metal layer; and
 an auxiliary barrier metal layer disposed in said second hollow portion defining a third hollow portion inside the auxiliary barrier metal layer, and separated from said barrier metal layer; and
 an auxiliary copper wiring layer filled in said third hollow portion,
 wherein said laminated interlayer insulating layers include an insulating copper diffusion preventing film disposed directly on said first damascene wiring and said first interlayer insulating layer, the insulating copper diffusion preventing film on the first damascene wiring having a bottom surface directly contacting the barrier metal layer, the copper wiring layer, the auxiliary barrier metal layer and the auxiliary copper wiring layer; and said multi-layer wiring includes an upper level via conductor disposed above said first damascene wiring, and contacting, through said insulating copper diffusion preventing film, directly with at least a top surface of the copper wiring layer of the first damascene wiring, and wherein said barrier metal layer, said auxiliary barrier metal layer and the insulating copper diffusion preventing film suppress diffusion of copper.

11. The semiconductor integrated circuit device according to claim 10, wherein at least one of said lower level wiring is constituted of a second damascene wiring including:
 a second barrier metal layer defining a bottom and a side wall of said second damascene wiring and defining a fourth hollow portion inside said second damascene wiring; and
 a continuous copper wiring layer filled in said fourth hollow portion.

12. The semiconductor integrated circuit device according to claim 10, wherein a top surface of the barrier metal layer, a top surface of the copper wiring layer, a top surface of the auxiliary barrier metal layer, a top surface of the auxiliary copper wiring layer are flush with a top surface of the first interlayer insulating layer.

13. The semiconductor device according to claim 10, wherein said upper level via conductor contacts a portion of said copper wiring layer and a portion of said auxiliary barrier metal layer.

14. The semiconductor device according to claim 13, wherein said upper level via conductor contacts a portion of said auxiliary copper wiring.

15. The semiconductor integrated circuit device according to claim 10, wherein said first interlayer insulating layer, said barrier metal layer, said copper wiring layer, said auxiliary barrier metal layer, and said auxiliary copper wiring layer have a common flat surface.

16. The semiconductor integrated circuit device according to claim 10, wherein said laminated interlayer insulating layers have different lamination of insulating films for an upper level interlayer insulating layer for an upper level wiring layer and a lower level interlayer insulating layer for a lower level wiring layer.

17. The semiconductor integrated circuit device according to claim 16, wherein the lower level interlayer insulating layer has a lower effective dielectric constant than that of the upper level interlayer insulating layer.

18. The semiconductor integrated circuit device according to claim 17, wherein the lower level interlayer insulating layer includes an organic insulating film.

19. The semiconductor integrated circuit device according to claim 10, wherein the lower level wiring layers have barrier metal layer and copper wiring layer, but no auxiliary barrier metal layer and no auxiliary copper wiring layer.

20. A semiconductor device comprising:
a semiconductor substrate;
a plurality of interlayer insulating layers formed above said semiconductor substrate, and including a first interlayer insulating layer below an uppermost interlayer insulating layer; and
a plurality of wiring layers including a first damascene wiring which is not an uppermost wiring layer and is buried in said first interlayer insulating layer, the first damascene wiring including:
a barrier metal layer defining a bottom and a side wall of said first damascene wiring and defining a first hollow portion inside said barrier metal layer;
a copper wiring layer disposed in said first hollow portion and defining a second hollow portion inside said copper wiring layer, the second hollow portion not contacting the barrier metal layer;
an auxiliary barrier metal layer disposed in said second hollow portion, separated from said barrier metal layer, and defining a third hollow portion inside the auxiliary barrier metal layer; and
an auxiliary copper wiring layer filling said third hollow portion;
wherein said plurality of wiring layers include an insulating copper diffusion preventing film directly disposed on a top surface of said barrier metal layer, top surface of said copper wiring layer, top surface of said auxiliary barrier metal layer, and a top surface of said auxiliary copper wiring layer of said first damascene wiring, and on a top surface of said first interlayer insulating layer;
wherein said plurality of wiring layers include an upper level via conductor disposed above said first damascene wiring in said plurality of interlayer insulating layers, and contacting through said insulating copper diffusion preventing film, directly with at least a top surface of the copper wiring layer of the first damascene wiring and;
wherein said copper wiring layer and said auxiliary copper wiring layer are separated solely by said auxiliary barrier metal layer, and said auxiliary barrier metal layer has a function of blocking growth of void generated from an interface of said auxiliary copper wiring layer and said insulating copper diffusion preventing film, and wherein said barrier metal layer, said auxiliary barrier metal layer and the insulating copper diffusion preventing film suppress diffusion of copper.

21. The semiconductor device according to claim 20, wherein said upper level via conductor contacts only a surface of said copper wiring layer.

22. The semiconductor device according to claim 20, wherein an area of a top surface of said copper wiring layer is narrower than an area of a bottom surface of said copper wiring layer.

23. The semiconductor device according to claim 20, wherein top surfaces of said barrier metal layer, copper wiring layer, auxiliary barrier metal layer and auxiliary copper wiring layer are flush with top surface of said first interlayer insulating layer.

24. The semiconductor device according to claim 20, wherein said upper level via conductor contacts a portion of said copper wiring layer and a portion of said auxiliary barrier metal layer.

25. The semiconductor device according to claim 24, wherein said upper level via conductor contacts a portion of said auxiliary copper wiring layer.

26. The semiconductor device according to claim 20, wherein said first interlayer insulating layer, said barrier metal layer, said copper wiring layer, said auxiliary barrier metal layer, and said auxiliary copper wiring layer have a common flat surface.

\* \* \* \* \*